United States Patent
Poirier

(10) Patent No.: US 9,356,325 B1
(45) Date of Patent: May 31, 2016

(54) ELECTRIFIED VEHICLE BATTERY PACK MONITORING ASSEMBLY AND METHOD

(71) Applicant: FORD GLOBAL TECHNOLOGIES, LLC, Dearborn, MI (US)

(72) Inventor: Eric Poirier, Taylor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 14/602,763

(22) Filed: Jan. 22, 2015

(51) Int. Cl.
*H01M 10/48* (2006.01)
*G01K 7/16* (2006.01)
*G01L 1/22* (2006.01)
*G01R 31/36* (2006.01)

(52) U.S. Cl.
CPC .............. *H01M 10/482* (2013.01); *G01K 7/16* (2013.01); *G01L 1/22* (2013.01); *G01R 31/3606* (2013.01); *H01M 10/486* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 5,640,077 A * | 6/1997 | Gillissen | H01M 2/1055 320/112 |
| 6,878,481 B2 | 4/2005 | Bushong et al. | |
| 8,395,519 B2 | 3/2013 | Cassidy | |
| 2002/0119364 A1* | 8/2002 | Bushong | H01M 2/0421 429/61 |
| 2005/0084754 A1* | 4/2005 | Klein | H01M 2/345 429/210 |
| 2008/0097704 A1* | 4/2008 | Notten | H01M 10/425 702/42 |
| 2013/0093383 A1* | 4/2013 | Kim | H02J 7/0026 320/107 |
| 2013/0330577 A1* | 12/2013 | Kristofek | H01M 2/1077 429/50 |

FOREIGN PATENT DOCUMENTS

| | | |
|---|---|---|
| JP | 57207878 | 12/1982 |
| JP | 05326027 | 12/1993 |
| JP | 06052901 | 2/1994 |

OTHER PUBLICATIONS

Mohan, Shankar, Kim, Youngki, Siegel, Jason B., Samad, Nassim A., and Anna G. Stefanopoulou, A Phenomenological Model of Bulk Force in a Li-Ion Battery Pack and Its Application to State of Charge Estimation, Journal of Electrochemical Society, Oct. 30, 2014, pp. A2222-A2231, vol. 161 (14).

* cited by examiner

*Primary Examiner* — Patrick Ryan
*Assistant Examiner* — Jose Colucci Rios
(74) *Attorney, Agent, or Firm* — Carlson, Gaskey & Olds, P.C.

(57) ABSTRACT

An exemplary monitoring assembly includes, among other things, a controller configured to identify a change in an internal pressure of a battery cell using a resistance measurement and a reference temperature measurement, the resistance measurement provided by a strain gauge associated with the battery cell.

20 Claims, 4 Drawing Sheets

ELECTRIFIED VEHICLE BATTERY PACK MONITORING ASSEMBLY AND METHOD

TECHNICAL FIELD

This disclosure relates generally to inspecting and diagnosing components and, more specifically, to estimating temperatures and internal pressures of a battery cell. The temperature is estimated using a strain gauge as a temperature and pressure dependent sensor.

BACKGROUND

Electrified vehicles use electric machines for propulsion. Electric vehicles, hybrid electric vehicles (HEVs), and plug-in hybrid electric vehicles (PHEVs) are example types of electrified vehicles. Battery packs power the electric machines. Various factors impact decisions to initiate additional inspections, service, or replace components. Internal pressure within electrochemical battery cells of the battery packs is one such factor.

SUMMARY

A monitoring assembly according to an exemplary aspect of the present disclosure includes, among other things a controller configured to identify a change in an internal pressure of a battery cell using a resistance measurement and a reference temperature measurement. The resistance measurement is provided by a strain gauge associated with the battery cell.

In another example of the foregoing assembly, the assembly includes a temperature sensor that collects the reference temperature measurement from a location spaced from the battery cell.

In another example of any of the foregoing assemblies, the location is within a battery pack that contains the battery cell.

In another example of any of the foregoing assemblies, the strain gage is secured to the battery cell.

In another example of any of the foregoing assemblies, the change is an increase in the internal pressure of the battery cell.

In another example of any of the foregoing assemblies, the controller is configured to calculate a battery cell apparent temperature using the resistance measurement. The change in internal pressure is indicated by a deviation of the battery cell apparent temperature from the reference temperature.

In another example of any of the foregoing assemblies, the resistance measurement and battery cell apparent temperature have a linear relationship prior to the deviation.

An assembly according to yet another exemplary aspect of the present disclosure includes, among other things, a battery pack to selectively power a motor. The assembly also includes a controller configured to compare an apparent temperature of a battery cell to a reference temperature measurement to identify a change in an internal pressure of a battery cell within the battery pack.

In another example of the foregoing assembly, the assembly includes a strain gauge that measures resistance to provide the resistance measurement. The resistance is dependent on an actual temperature of the battery cell and the internal pressure of the battery cell.

In another example of any of the foregoing assemblies, the strain gauge is directly attached to the battery cell.

In another example of any of the foregoing assemblies, the reference temperature measurement is a temperature measured from an area of the battery pack.

In another example of any of the foregoing assemblies, the change is a drift of a resistance measured by a strain gauge secured to the battery cell.

A battery cell monitoring method according to still another exemplary aspect of the present disclosure includes, among other things, estimating a battery cell temperature using a resistance measurement from a strain gauge, and initiating an alert in response to the battery cell temperature deviating from a reference temperature.

In another example of any of the foregoing method, the reference temperature is a temperature of a battery pack.

In another example of any of the foregoing methods, the strain gauge is directly attached to a battery cell.

In another example of any of the foregoing methods, the deviating comprised deviating from a linear relationship at constant pressure with the reference temperature.

In another example of any of the foregoing methods, the deviating comprises the battery cell temperature differing from the reference temperature by more than an established statistical deviation for a set period of time.

In another example of any of the foregoing methods, the reference temperature varies over time.

In another example of any of the foregoing methods, the alert comprises a readjustment of a power limit of a battery pack.

In another example of any of the foregoing methods, the alert indicates an increase in an internal pressure of a battery cell.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure relates generally to inspecting and diagnosing components and, more specifically, to estimating temperatures and internal pressures of a battery cell. The temperature is estimated using a strain gauge as a temperature and pressure dependent sensor.

The Ohmic resistance of a strain gauge installed on the battery cell can change in response to strain on a wall of the battery cell resulting from internal pressure. The Ohmic resistance of strain gauges can instead, or additionally, change in response to thermal dilatation of the strain gauge itself or the wall resulting from changes in temperature.

The Ohmic resistance of the strain gauge resistance is thus both temperature and pressure (strain) dependent. The Ohmic resistance thus exhibits a temperature dependent response in addition to strain response. An apparent temperature of the battery cell extracted from measurements taken by the associated strain gauge includes these two characteristics.

A deviation exceeding established limits between and apparent temperature of the battery cell and a reference temperature is also used to identify excessive temperature and/or pressure conditions in real time. A deviation exceeding established limits between the apparent temperature and the reference temperature is used to identify pressure build-up within the battery cell. The identification can be under equilibrium temperature conditions or following a set wait time.

The reference temperature is used to establish the contribution of the temperature and pressure characteristics to the apparent temperature of the battery cell calculated using the resistance from the strain gauge.

Figure 1:
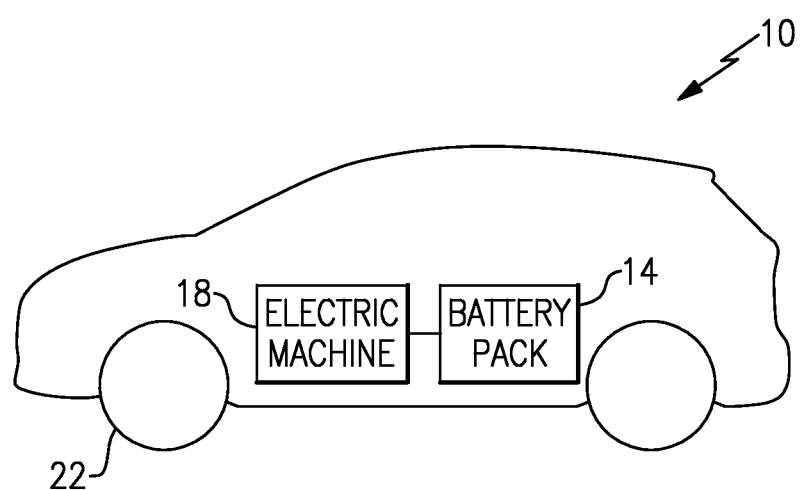
FIG. 1 illustrates a schematic view of an example electrified vehicle.

Referring to FIG. 1, an example electrified vehicle 10 includes a battery pack 14 to power an electric machine 18. The vehicle includes wheels 22 driven by the electric machine 18. The electric machine 18 receives electric power from the battery pack 14 and converts the electric power to torque.

The example vehicle 10 is an all-electric vehicle. In other examples, vehicle 10 is a hybrid electric vehicle, which selectively drives the wheels 22 using an internal combustion engine instead of, or in addition to, the electric machine 18. In hybrid electric examples, the electric machine 18 may selectively operate as a generator to recharge the battery pack 14.

Figure 2:
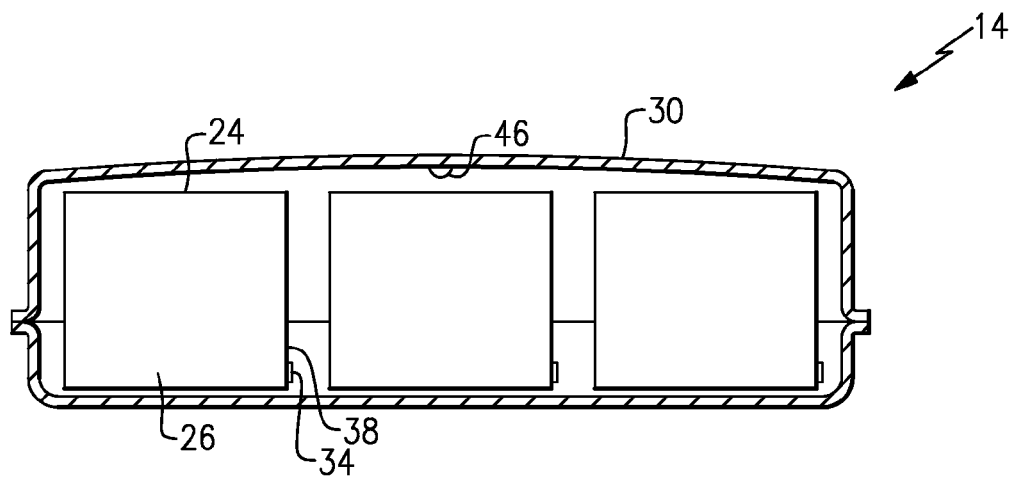
FIG. 2 illustrates a section view of a battery pack from the electrified vehicle of FIG. 1.
Figure 3:
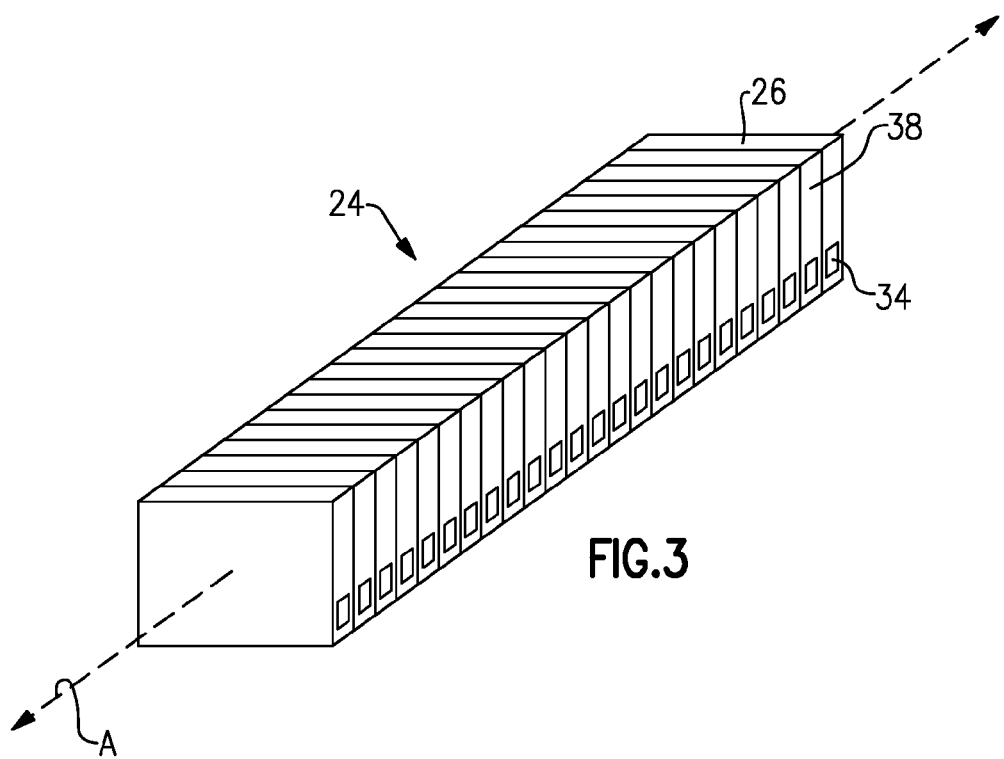
FIG. 3 illustrates a perspective view of an array from the battery pack of FIG. 1.
Figure 4:
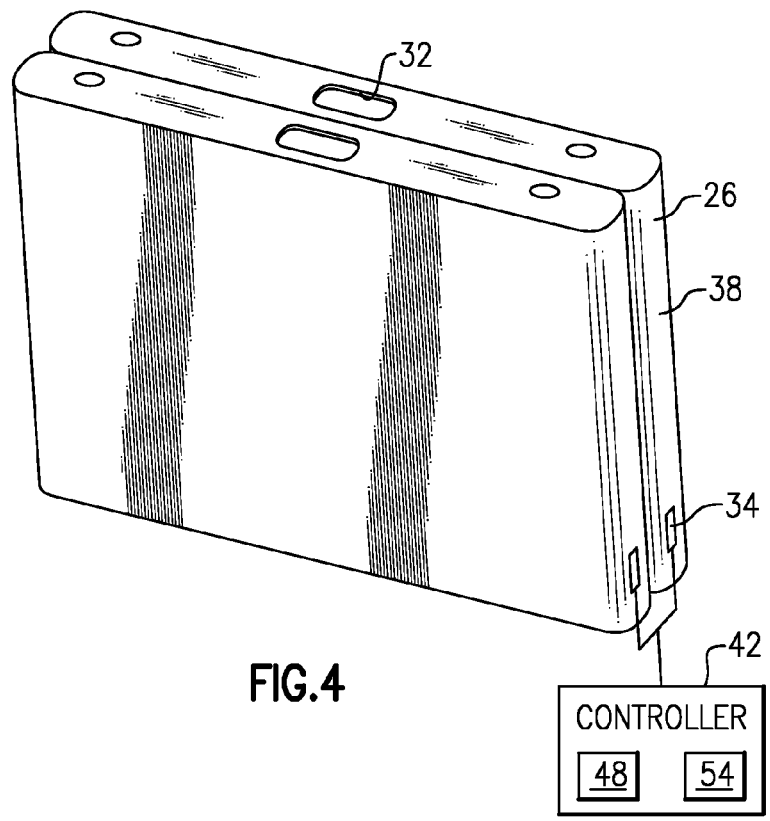
FIG. 4 illustrates a perspective view of two battery cells from the battery pack of FIG. 1.

Referring now to FIGS. 2 to 4, the battery pack 14 includes, among other things a plurality of arrays 24 of battery cells 26 within a housing 30. The battery cells 26 of the arrays 24 are each disposed along a respective axis A.

The battery cells 26 of the arrays 24 may be compressed axially by end walls (not shown). Other components, such as sidewalls and covers, may surround other sides of the battery cells 26.

In some example embodiments, the battery pack 14 may include from 50 to 500 individual battery cells 26 within each of the arrays 24. In other examples, the battery pack 14 may include just a single cell. The cells are lithium ion cells in this example. Other battery packs 14 may include other numbers of battery cells 26.

The battery cells 26 include vent ports 32, which are closed during normal operation of the battery pack 14. The expansion of gases within one of the battery cells 26 can force open the vent port 32 for that battery cell 26, which then provides a path for gases to move out from an interior of the battery cell 26.

Identifying a pressure build-up within the battery cell 26 can be useful to prevent damages due to cell venting. The sooner the pressure build-up is identified, the sooner the battery cell 26 or battery pack 14 can be replaced or repaired, for example.

A strain gauge 34 is secured to an outwardly facing surface 38 of each of the battery cells 26. The example strain gauge 43 is subject to strain upon pressure build-up with the battery cells 26. The strain gauges 34 are operatively connected to a controller 42. In some examples, the controller 42, or portions of the controller 42, are contained within the housing 30. In other examples, the controller 42 is outside the housing 30.

The controller 42 is, in some examples, a Battery Management System (BMS) including a Battery Energy Control Module (BECM). In other examples, the controller 42 is a specific controller designed to carry out the exemplary methods of this disclosure.

The BMS can control the power drawn from battery pack 14 within by the electric machine 18 based in part on feeds indicative of the State of Health (SOH) of the individual battery cells 26 of the battery pack 14. Sensor feeds typically include voltage and a directly measured temperature of the battery cells 26. Based on the determined SOH of the battery cells 26, the amount of current (or power) drawn from the battery cells may be limited in order to avoid battery cell degradation due to excessive charge or discharge. In examples where the controller 42 is a BMS, the addition of internal pressure as feed to the BMS improves SOH monitoring.

In some examples, battery pack monitoring conducted by the BMS uses cell voltage and the temperature to prevent excessive current being drawn from the battery cells 26 by the electric machine 18 and to identify failure conditions associated with the battery cells 26.

The example strain gauge 34 is less than five millimeters long and less than four millimeters wide. Examples of strain gauge materials are nickel-chromium alloy (Karma), copper-nickel alloy (Constantan) and silicon based materials.

The strain gauge 34 could be installed on a laterally outboard side of the battery cells 26 as shown in FIG. 4. The strain gauge 34 could also be installed on the largest sides of the battery cells 26 within voids of spacers positioned axially between adjacent battery cells 26. The strain gauge 34 could also be positioned onto, or adjacent to, the vent port 32.

In some examples, the strain gauge 34 is adhesively secured to an external wall of the battery cell 26 using a cyanoacrylate or epoxy adhesive. The strain gauge 34 could instead, or additionally, be compressed against the battery cell 26 by a portion of the housing 30. The strain gauge 34 can be linear, two-dimensional, or three-dimensional.

A temperature sensor 46 is disposed within the battery pack 14. The temperature sensor 46 is, in this example, mounted to the housing 30 and spaced from the battery cells 26 and the arrays 24. The temperature sensor 46 is operatively connected to the controller 42 and used as to collect a reference temperature. The temperature sensor 46 could be a thermocouple or a thermistor.

Alternatively, the reference temperature can be the average temperature of the apparent temperatures from all or some of the remaining battery cells 26.

Different areas of the battery pack 14 can have different temperatures. The internal temperature of one of the battery cells 26 can differ from the temperature measured by the temperature sensor 46.

The controller 42 uses information from the strain gauges 34 to monitor the battery pack 14. For example, the controller 42 monitors internal temperatures of the battery cells 26 using apparent temperatures that are calculated using measurements from the strain gauges 34. The controller 42 uses calibration parameters to estimate internal temperatures for the battery cells 26 using resistance measurements from the strain gauges 34. Calibration parameters are associated with functions relating strain gauge resistance (R) and temperature (T) and pressure (P). In one example, such relationship $R=f(T,P)$ is a linear curve at constant pressure. The value of the strain gauge resistance is used as a dynamic parameter feeding into the controller 42.

Notably, the internal temperatures of the battery cells 26 are estimated without requiring a specific temperature sensor, such as a thermocouple, to be associated with each of the battery cells 26.

Temperature monitoring of the battery pack 14 and the individual battery cells 26 is often used to identify overheating. Excessive current delivered from the battery pack 14 to the electric machine 14 can lead to overheating, for example.

The temperature of one of the battery cells 26 can increase as a result of Joule heating, which results from power (P) being dissipated as heat by electric current (I) flowing through the internal resistance ($R_{int}$) of the battery cell 26, as given by $P=R_{int}I^2$. Excessive temperatures can promotes deleterious chemical side reactions in the internal components of the battery cell 26, such as the electrolyte, that can lead to degradation and gas generation.

The example controller 42 includes a processor 48 operatively linked to a memory portion 54. The example processor 48 is programmed to execute a program stored in the memory portion 54. The program may be stored in the memory portion 54 as software code.

The program stored in the memory portion 54 may include one or more additional or separate programs, each of which includes an ordered listing of executable instructions for implementing logical functions.

The processor 48 can be a custom made or commercially available processor, a central processing unit (CPU), an auxiliary processor among several processors associated with the controller 42, a semiconductor based microprocessor (in the form of a microchip or chip set) or generally any device for executing software instructions.

The memory portion 54 can include any one or combination of volatile memory elements (e.g., random access memory (RAM, such as DRAM, SRAM, SDRAM, VRAM, etc.)) and/or nonvolatile memory elements (e.g., ROM, hard drive, tape, CD-ROM, etc.). The memory may further incorporate electronic, magnetic, optical, and/or other types of storage media. Note that the memory can also have a distributed architecture, where various components are situated remotely from one another, but can be accessed by the processor 48.

In this example, an apparent temperature for each of the battery cells 26 is calculated via the individual strain gauges 34 providing the controller 42 with Ohmic resistance measurements. Changes in the internal temperature of the battery cells 26 can change the resistance measurements.

The controller 42 calculates the apparent temperatures for each of the battery cells 26 using the resistance across the strain gauge 34 associated with the battery cells 26. The apparent temperature (T) is a function of the resistance (R) provided by the strain gauge 34. The apparent temperature are thereof established from a parameterized calibration function $R=f(T,P)$.

The controller 42 then executes a program stored in the memory portion. The program calculates whether the internal pressure of the battery cells 26 is excessive. The program uses the resistance measurements from the strain gauges 34, apparent temperature measurements, temperature measurements from the temperature sensor 46, or some combination of these.

The average temperature and its standard deviation, as read on all strain gauges 34, can be used as a reference to establish a deviating measurement. In such case, a measurement outside the expected standard deviation can be considered as not correlated with the reference.

In one example, if the internal pressure of a given one of the battery cells 26 is consistent over time, the resistance measurements from the strain gauge 34 associated within that battery cell 26 will vary linearly with reference temperature measurements from the temperature sensor 46. The resistance and reference temperature are thus considered to have a linear relationship, such that dR/dT is constant, when the internal pressure of a given one of the battery cells 26 is consistent. Such relationship may be used as a baseline or initial correlation.

Figure 5:
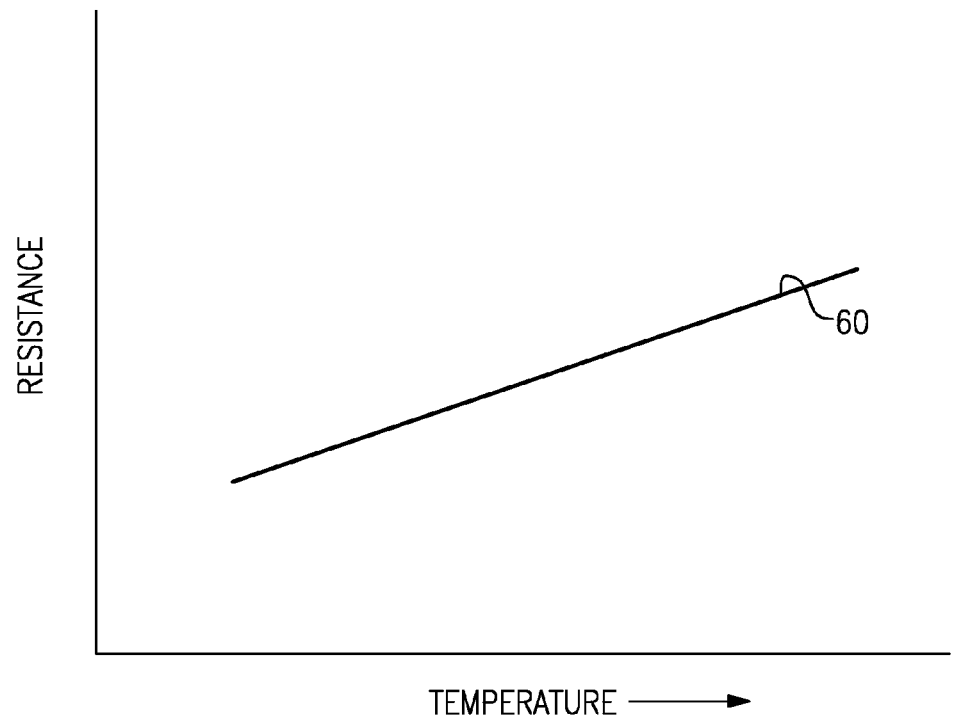
FIG. 5 illustrates a linear relationship between resistance measurements and a temperature of the battery pack of FIG. 1.

FIG. 5 shows a linear relationship 60 between resistance measurements from the strain gauge and the reference temperature measurements from the temperature sensor 46. When the internal pressure of a given one of the battery cells 26 is kept consistent, resistance measurements will increase as actual temperature within battery pack 14 increases.

Baseline relationships other than linear may be possible in other examples.

Referring again to FIGS. 1 to 4, If the apparent temperature matches, or is correlated well with, the reference temperature measurement for the temperature sensor 46, the apparent temperature is considered a true temperature value and the internal pressure within the battery cell 26 stable.

In this example, an apparent temperature that is correlated well with the reference temperature from the temperature sensor 46 is within two degrees of the reference temperature. In another example, an apparent temperature that is correlated well with the temperature measurement from the temperature sensor 46 is an apparent temperature that is within four degrees of the reference temperature from the temperature sensor 46.

In another example, an apparent temperature that is correlated well with the temperature measurement from the temperature sensor 46 is within established statistical deviation from the temperature measurement from temperature sensor 46.

From time to time, expanding gasses within one of the battery cells 26 can cause a significant increase in internal pressure of the battery cell 26. This causes the apparent internal temperature to deviate from its initial correlation with the temperature measurement from the temperature sensor 46. Thus, if the apparent temperature does not match or correlate will with the temperature measurement from the temperature sensor 46, the apparent temperature is considered to be a compound temperature value including in part strain due to pressure. In such an example, the internal pressure within the battery cell 26 is considered to have changed, or to be less stable.

In this example, an apparent temperature that is not correlated well with the reference temperature from the temperature sensor 46 has an absolute value that is more than two degrees greater than the temperature measurement. In another example, an apparent temperature that is not correlated well with the reference temperature from the temperature sensor 46 is an apparent temperature having an absolute value that is more than four degrees greater than the temperature measurement from the temperature sensor 46.

In another example, an apparent temperature that is not correlated well with the temperature measurement from the temperature sensor 46 is outside established statistical deviation from the temperature measurement from temperature sensor 46. The deviation can comprises the apparent temperature differing from the temperature measurement from the temperature sensor 46 by more than the statistically established error of the particular sensor.

Figure 6:
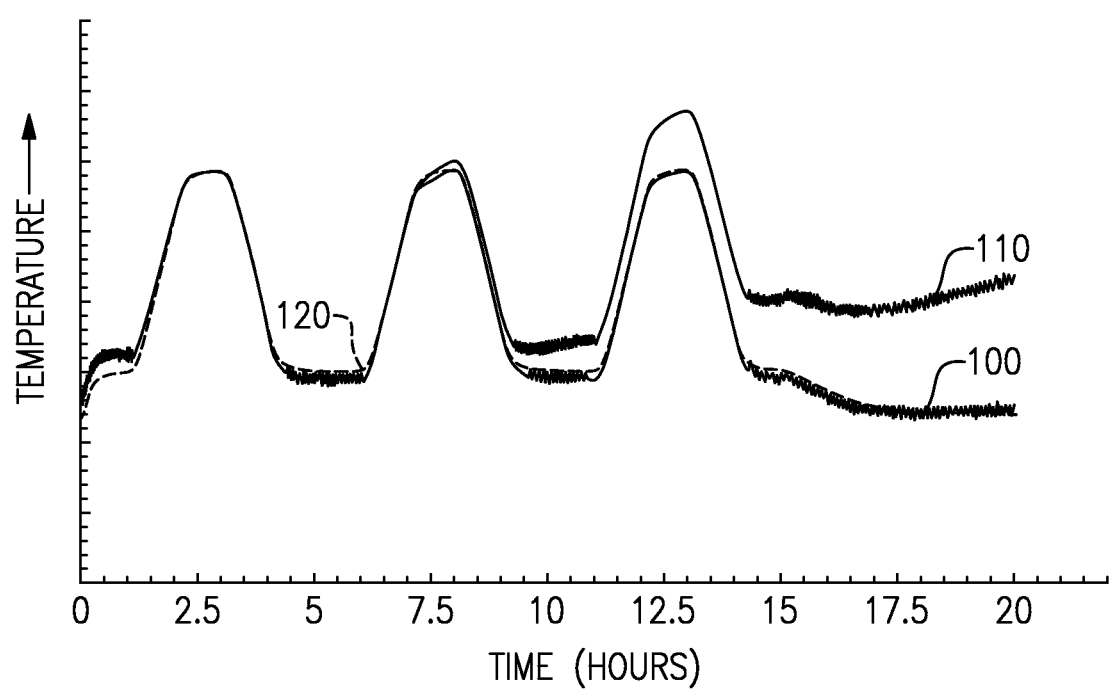
FIG. 6 graphically illustrates an exemplary pressure build-up scenario.

Referring to the pressure build-up scenario of FIG. 6, a solid line 100 represents an apparent temperature calculated for a first battery cell of the battery pack 14, and a solid line 110 represents an apparent temperature calculated for a second battery cell of the battery pack 14. A dashed line 120 represents the reference temperature from the temperature sensor 46.

During the first seven hours of operation, the apparent temperature lines 100 and 110 correlate well with the reference temperature 120. At seven hours, internal pressure within the first battery cell begins to gradually increase. The change in internal pressure translates into measurable strain associated with consequent deformation or swelling of the first battery cell. The increase may be due to an internal event within the battery cell. Thus, the solid line 110 begins to deviate from the dashed line 120.

After operating for 11.5 hours, the apparent temperature of the first battery cell is about five degrees different than the reference temperature. In this example, this difference causes the controller 42 to adjust power limits for the battery pack 14. The controller 42 can, for example, set new maximum values in the control algorithm for how much current can be drawn to or from the battery pack 14 to prevent excessive charge or discharge per the new conditions.

After operating for 15.5 hours, the apparent temperature of the first battery cell is about ten degrees different than the reference temperature. In this example, this difference causes the controller 42 to initiate an alert, such as an in-dash visual alert for the driver, a service alarm, or to shut down operation of the battery pack 14, or to readjust the power limits of the battery pack 14 power limits. The alert may prompt an inspection, a servicing, or a replacing of components such as one or more of the battery cells 38 in the battery pack 14.

Strain gauges are used to monitor the internal temperatures of battery cells. The disclosed examples also identify increases in internal pressure using the strain gauges. Internal battery cell temperature and pressure are thus both monitored using strain gauges. The temperature dependence of the resistance of various types of strain gauges can be used to achieve these results. The use of a single type of sensor for both temperature and pressure monitoring provide for much added value at little additional cost.

Some of the example embodiments make use of temperature dependent changes in the strain gauge resistance owing to thermal dilatation of the gauge material itself or of the specimen materials on which the gauge is installed. The resistance, as read with the strain gauge is translated into an apparent temperature value compounding a "true" temperature characteristic with a pressure (or strain) related characteristic.

The individual contributions of the pressure and temperature characteristics to the apparent temperature are established by comparison with the reference temperature.

Pressure measurements based on resistance measurements from the strain gauges can be conveyed to the BMS, or another type of controller, in addition to temperature measurements based on the resistance. Temperature and voltage can be used by the BMS to adjust the vehicle power limits and prevent over-discharge, for example. Adding a pressure feed can refine that procedure for better battery pack durability/performance.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

I claim:

1. A monitoring assembly, comprising:
a controller configured to identify a change in an internal pressure of a battery cell using a resistance measurement and a reference temperature measurement, the resistance measurement provided by a strain gauge associated with the battery cell, the change identified based on a difference between the reference temperature measurement and a battery cell apparent temperature that is calculated using the resistance measurement.

2. The monitoring assembly of claim 1, including a temperature sensor that collects the reference temperature measurement from a location spaced from the battery cell.

3. The monitoring assembly of claim 2, wherein the location is within a battery pack that contains the battery cell.

4. The monitoring assembly of claim 1, wherein the change is an increase in the internal pressure of the battery cell.

5. The monitoring assembly of claim 1, wherein the difference comprises a deviation of the battery cell apparent temperature from the reference temperature.

6. The monitoring assembly of claim 5, wherein the resistance measurement and battery cell apparent temperature have a linear relationship prior to the deviation.

7. An assembly, comprising:
a battery pack to selectively power a motor; and
a controller configured to compare an apparent temperature of a battery cell to a reference temperature measurement to identify a change in an internal pressure of a battery cell within the battery pack.

8. The assembly of claim 7, further comprising a strain gauge that measures resistance to provide the resistance measurement, the resistance dependent on an actual temperature of the battery cell and the internal pressure of the battery cell.

9. The assembly of claim 8, wherein the strain gauge is directly attached to the battery cell.

10. The assembly of claim 7, wherein the reference temperature measurement is a temperature measured from an area of the battery pack spaced from the battery cell, and the apparent temperature is based on the resistance measurement.

11. The assembly of claim 7, wherein the change is indicated by a drift of a resistance measured by a strain gauge secured to the battery cell.

12. A battery cell monitoring method, comprising: calculating an apparent cell temperature using a resistance measurement from a strain gauge; and initiating an alert in response to the battery cell temperature deviating from a reference temperature in response to a difference between the apparent battery cell temperature and a reference temperature.

13. The battery cell monitoring method of claim 12, wherein the reference temperature is a temperature of a battery pack.

14. The battery cell monitoring method of claim 12, wherein the strain gauge is directly attached to a battery cell.

15. The battery cell monitoring method of claim 12, wherein the difference comprises the apparent battery cell temperature deviating from a linear relationship at constant pressure with the reference temperature.

16. The battery cell monitoring method of claim 12, wherein the difference comprises the apparent battery cell temperature differing from the reference temperature by more than an established statistical deviation for a set period of time.

17. The battery cell monitoring method of claim 12, wherein the reference temperature varies over time.

18. The battery cell monitoring method of claim 12, wherein the alert comprises a readjustment of a power limit of a battery pack.

19. The battery cell monitoring method of claim 12, wherein the alert indicates an increase in an internal pressure of a battery cell.

20. The monitoring assembly of claim 1, wherein the controller is further configured to calculate the battery cell apparent temperature using the resistance measurement.

\* \* \* \* \*